United States Patent
Kuroda (10) Patent No.: US 6,593,230 B1
(45) Date of Patent: Jul. 15, 2003

(54) METHOD OF MANUFACTURING SEMICONDUCTOR DEVICE

(75) Inventor: Takahiko Kuroda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/225,557

(22) Filed: Jan. 5, 1999

(30) Foreign Application Priority Data

Jan. 14, 1998 (JP) ............................................. 10-020464

(51) Int. Cl.⁷ ......................................... H01L 21/4763
(52) U.S. Cl. ...................... 438/637; 438/624; 438/626; 438/712; 438/714; 438/737; 438/743
(58) Field of Search .............................. 438/627, 626, 438/637, 712, 714, 718, 723, 737, 743

(56) References Cited

U.S. PATENT DOCUMENTS

| | | | |
|---|---|---|---|
| 5,002,902 A | * 3/1991 | Watanabe | 438/401 |
| 5,269,879 A | * 12/1993 | Rhoades et al. | 264/4.6 |
| 5,795,820 A | * 8/1998 | Kepler | 438/624 |
| 5,869,404 A | * 2/1999 | Kim et al. | 438/738 |
| 5,920,796 A | * 7/1999 | Wang et al. | 438/700 |
| 6,025,255 A | * 2/2000 | Chen et al. | 438/595 |

FOREIGN PATENT DOCUMENTS

| | | | | |
|---|---|---|---|---|
| JP | 7-122634 | 5/1995 | | |
| JP | 8-236619 | 9/1996 | | |
| JP | 9-17862 | 1/1997 | | |
| JP | 9-148270 | 6/1997 | | |
| JP | 10135191 | * 5/1998 | ....... | H01L/21/3065 |
| JP | 10154752 | * 6/1998 | ......... | H01L/21/768 |

OTHER PUBLICATIONS

Kenji et al. (JP 8–236619A), Translation. (Sep. 1996).*
Ueno et al. (JP 10135191) (Translation) (May 1998).*
Kuroda et al. (JP 10154752) (Jun. 1998).*

* cited by examiner

Primary Examiner—Amir Zarabian
Assistant Examiner—Maria Guerrero
(74) Attorney, Agent, or Firm—Dickstein Shapiro Morin & Oshinsky LLP (57) ABSTRACT

A lowest-layer insulating film and at least one upper-layer insulating film are used. The etching rate for the lowest-layer insulating film changes in response to change in flow rate of a predetermined etching reactive gas. The etching rate for the at least one upper-layer insulating film under the condition in which the flow rate of the etching reactive gas is a first flow rate such that the etching rate for the lowest-layer insulating film is low is higher than the etching rate for the lowest-layer insulating film under the condition in which the flow rate of the etching reactive gas is the first flow rate. First etching is performed under the condition in which the flow rate of the etching reactive gas is the first flow rate. Then, second etching is performed under the condition in which the flow rate of the etching reactive gas is a second flow rate such that the etching rate for the lowest-layer insulating film is high.

7 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device having a multi-layer wiring structure, and, in particular, to a method of manufacturing a semiconductor device including a process of forming via holes having different depths by etching an insulating film such as an oxide film.

2. Description of the Related Art

Figure 1:
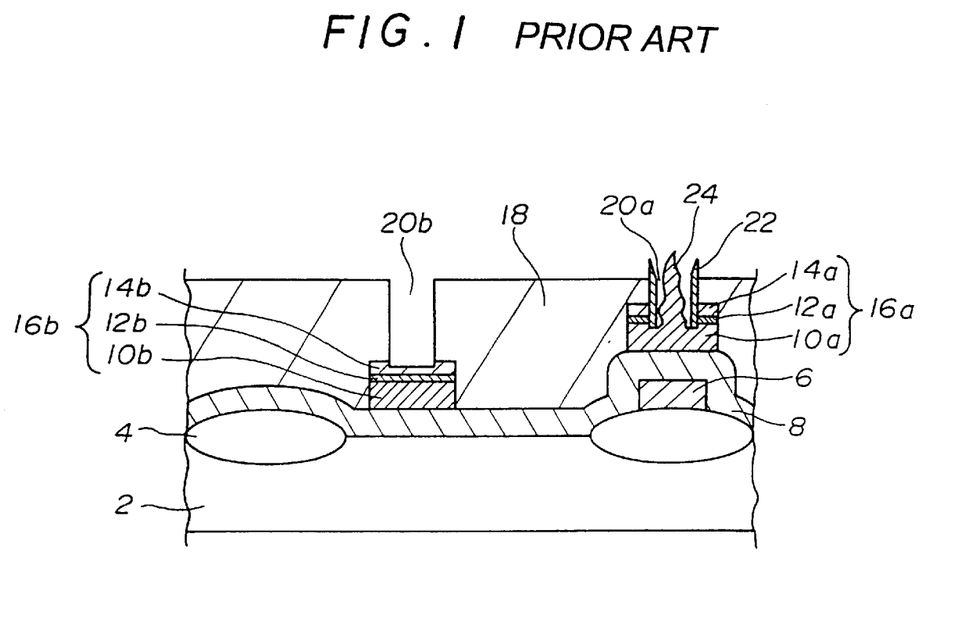
FIG. 1 shows a sectional view of a semiconductor device of the related art in a condition in which via holes have been formed.

FIG. 1 shows a sectional view of a semiconductor device of the related art in a condition in which via holes have been formed. An interlayer insulating film 8 is formed on a semiconductor substrate 2 including a device-isolating region 4 and a gate electrode 6. On the interlayer insulating film 8, wiring layers 16 (16a, 16b) are formed, as a result of AlCu films 10 (10a, 10b), Ti films 12 (12a, 12b) and TiN films 14 (14a, 14b) being deposited, at predetermined positions. On the interlayer insulating film 8 including the wiring layers 16a, 16b, an interlayer insulating film 18 is formed and is planarized through conventional planarization. In the interlayer insulating film 18, a shallow via hole 20a and a deep via hole 20b are formed above the wiring layers 16a and 16b, respectively.

When such via holes having different depths are formed through conventional dry etching, an underlying pattern located below a shallow via hole is damaged seriously in comparison to an underlying pattern located below a deep via hole. As a result of the damage, the contact resistance value of the via hole increases, variation of the contact resistance value of the via hole increases and, thus, reliability of a semiconductor device is degraded.

For example, in a case where inter-wiring-layer via holes are formed, through conventional dry etching, when underlying wiring layers 16a, 16b include AlCu films 10a, 10b, Ti films 12a, 12b and TiN films 14a, 14b, a via hole 20a in which both the TiN film 14a and the Ti film 12a of the underlying wiring layer 16a are etched through to the bottom thereof and a via hole 20b in which the TiN film 14b and the Ti film 12b of the underlying wiring layer 16b remain are formed above the same substrate 2 depending on thickness of a planarized interlayer film 18. In particular, in the via hole 20a in which the TiN film 14a and the Ti film 12a are etched through to the bottom thereof, Al of the AlCu film 10a of the underlying wiring layer 16a reacts to a gas of a CF family which is an etchant, and a low-volatile fluoride 22 is formed and is deposited on the sidewall of the via hole 20a. The fluoride 22 increases the contact resistance of the via hole 20a and increases variation of the resistance value. Further, during a degassing process on the order of 500° C. performed before an upper wiring layer is formed, Al of the AlCu film 10a, exposed at the bottom of the via hole 20a as a result of the TiN film 14a and the Ti film 12a being etched through to the bottom thereof, may blow out, and, as a result, short-circuiting between wiring patterns may occur.

Thus, when via holes having different depths are formed in a conventional etching method, damage caused to underlying patterns located below the via holes is different depending on the depths of the via holes. In particular, reliability of a shallow via hole is greatly degraded.

In order to solve such a problem, methods which will be described below have been proposed.

In order to eliminate the difference between etching times required for forming respective via holes due to the level difference between respective metallic wiring layers caused by field oxide layers or the like, the following method has been proposed in Japanese Laid-Open Patent Application No. 7-122634: An interlayer insulating film including a film having a low etching rate, a film having a high etching rate and a film having a low etching rate when a predetermined etching gas is used, in the stated order, is formed, wherein each film having the low etching rate has a uniform thickness and the film having the high etching rate has a planer surface. In this method, an organic silicon compound including a CF radical is used as the film having the high etching rate. In the interlayer insulating film formed on the respective metallic wiring layers, although the thickness of each layer having the low etching rate is uniform, the thickness of the layer having the high etching rate varies. However, because the etching time required for forming the via holes in the film having the high etching rate is approximately equal regardless of the depth, it is possible to equalize the etching times required for forming the respective via holes.

Another method has been proposed in Japanese Laid-Open Patent Application No. 9-148270. In this method, for a variation in a film thickness of a film to be etched which variation is caused by an underlying structure (a level variation, etc.), an etching mask is formed such that aspect ratios (depths of via holes/diameters of the via holes) after etching of the via hole formed in a thin-film area and the via hole formed in a thick-film area are approximately equal to each other. As a result of the aspect ratios of the respective via holes being approximately equalized, etching completion times required for forming the via holes are approximately equalized, and, thereby, underlying patterns are prevented from being adversely affected.

Another method has been proposed in Japanese Laid-Open Patent Application No. 8-236619. In this method, an interlayer insulating film is a multi-layer film, and the respective films of the multi-layer film are deposited such that the etching rate increases sequentially starting from the substrate-side film, that is, the film having an etching rate which is extremely low in comparison to the other insulating films is formed nearest to the substrate. By using such an interlayer insulating film, the etching margin is ensured even at a thin part of the interlayer insulating film, and, thus, over-etching at the thin part thereof is prevented.

Another method has been proposed in Japanese Laid-Open Patent Application No. 9-17862. In this method, on a wiring pattern above which a via hole is formed and a planarized interlayer insulating film is thin, a film of a material having a low etching rate is previously formed. As a result of the film of the material having the low etching rate being formed at a specific position, an etching margin is ensured even at a thin part of the interlayer insulating film, and, thus, over-etching at the thin part thereof is prevented.

However, in the method disclosed in Japanese Laid-Open Patent Application No. 7-122634, the organic silicon compound including the CF radical is used as the film having the high etching rate. If this film is exposed on the sidewall of the via hole at a time of photoresist removal using $O_2$ after etching, a chemical reaction occurs, and, thereby, the via hole may be damaged. In order to prevent this film from being exposed inside the via hole, it is necessary to perform an etch-back process such that the organic silicon compound is prevented from remaining at a position at which the via hole is formed. As a result, a number of processes to be performed increases, and variation in thickness of the interlayer insulating film increases.

In the method disclosed in Japanese Laid-Open Patent Application No. 9-148270, in order to equalize the etching times required for forming the via holes having the different depths, it is necessary to vary the diameters of the via holes depending on the depths thereof. Such a manner is not a practical one.

In the method disclosed in Japanese Laid-Open Patent Application No. 8-236619, etching is performed on the plurality of films having different etching rates at the same time. Therefore, control of the shapes of the via holes is difficult.

In the method disclosed in Japanese Laid-Open Patent Application No. 9-17862, the process of previously forming the film of the material having the low etching rate at the bottom of the interlayer insulating film is added. Further, after etching is performed on the interlayer insulating film, a process of removing the above-mentioned film of the material having the low etching rate is necessary to be performed. Thus, the number of processes increases and the processes are complicated.

SUMMARY OF THE INVENTION

An object of the present invention is to improve reliability of via holes and wirings as a result of controlling and equalizing damage caused to underlying patterns at the bottom of the via holes having different depths, when the via holes having the different depths are formed through dry etching.

A method of manufacturing a semiconductor device, according to the present invention, in which an interlayer insulating film is formed on an underlayer having a level variation, the surface of the interlayer insulating film being planarized, upper wiring layers and lower wiring layers being electrically connected through via holes formed in the interlayer insulating film so that a multi-layer wiring is provided, comprises the steps of:

a) forming a lowest-layer insulating film of the interlayer insulating film on the underlayer, the etching rate for the lowest-layer insulating film changing in response to change in flow rate of a predetermined etching reactive gas in a first manner;

b) forming at least one upper-layer insulating film of the interlayer insulating film on the lowest-layer insulating film, the etching rate for the at least one upper-layer insulating film changing in response to change in flow rate of the predetermined etching reactive gas in a second manner different from the first manner;

c) planarizing the surface of the at least one upper-layer insulating film;

d) forming a photoresist on the at least one upper-layer insulating film, the photoresist having openings at positions at which the via holes are formed in the lowest-layer insulating film and the at least one upper-layer insulating film;

e) etching the at least one upper-layer insulating film below the openings under a condition in which the flow rate of the predetermined etching reactive gas is such that the etching rate for the lowest-layer insulating film is low;

f) etching the lowest-layer insulating film below the openings under a condition in which the flow rate of the predetermined etching reactive gas is such that the etching rate for the lowest-layer insulating film is high;

g) removing the photoresist; and h) forming the upper wiring layers above the via holes.

Thus, in the semiconductor-device manufacturing method according to the present invention, the lowest-layer insulating film and the at least one upper-layer insulating film are used. The etching rate for the lowest-layer insulating film changes in response to change in flow rate of the predetermined etching reactive gas. The etching rate for the at least one upper-layer insulating film under the condition in which the flow rate of the etching reactive gas is a first flow rate such that the etching rate for the lowest-layer insulating film is low is higher than the etching rate for the lowest-layer insulating film under the condition in which the flow rate of the etching reactive gas is the first flow rate. First etching (the step e)) is performed under the condition in which the flow rate of the etching reactive gas is the first flow rate. Then, second etching (the step f)) is performed under the condition in which the flow rate of the etching reactive gas is a second flow rate such that the etching rate for the lowest-layer insulating film is high.

The thicknesses of the at least one upper-layer insulating film at the positions at which the respective via holes are formed are different from each other because the underlayer has the level variation and the surface of the at least one upper-layer insulating film is planarized. In the step e) (first etching) in which the at least one upper-layer insulating film is etched at the positions at which the via holes are formed, the lowest-layer insulating film is also etched at the position at which the thickness of the at least one upper-layer insulating film is thin and the shallow via hole is formed, when the at least one upper-layer insulating film is etched through to the bottom thereof at the position at which the thickness of the at least one upper-layer insulating film is thick and the deep via hole is formed. However, in the step e), etching is performed under the condition under which the etching rate for the lowest-layer insulating film is low. Therefore, merely a slight depth of the lowest-layer insulating film is etched. After the at least one upper-layer insulating film is etched at the position at which the thickness of the at least one upper-layer insulating film is thick and the deep via hole is formed so that the lowest-layer insulating film is exposed at this position, the step f) (the second etching) is performed. In the step f), the lowest-layer insulating film is etched at the positions at which the respective via holes are formed. As a result, it is possible to control the etched amount in thickness of the underlying pattern (lower wiring layer) at the position at which the shallow via hole is formed to be sufficiently small under the condition in which a predetermined over-etching ratio is achieved for the deep via hole. Thereby, it is possible to equalize the conditions of the bottoms of the respective via holes and to form the via holes and wirings having high reliability.

When the etching rate for the lowest-layer insulating film is equal to or less than 1/5 of the etching rate for the at least one upper-layer insulating layer in the first etching (the step e)), it is possible to sufficiently control the depth of the lowest-layer insulating film etched in the first etching at the position at which the shallow via hole is formed. As a result, it is possible to effectively reduce the depth of the underlying pattern (lower wiring layer) etched in the second etching (the step f)) at the position at which the shallow via hole is formed.

When a silicon oxide film is used as the lowest-layer insulating film and a gas including $C_4F_8$ is used as the etching reactive gas, it is possible to sufficiently change the etching rate for the lowest-layer insulating film by adjusting the flow rate of the gas including $C_4F_8$.

Other objects and further features of the present invention will become more apparent from the following detailed description when read in conjunction with the accompanying drawings.

DETAILED DESCRIPTION OF THE PREFERRED EMBODIMENT

It is preferable that the etching rate for a lowest-layer insulating film be equal to or less than 1/5 of the etching rate for upper-layer insulating films, at first etching. As a result, it is possible to control the amount of the lowest-layer insulating film removed through the first etching to be sufficiently small. Further, it is possible to effectively reduce the amount of underlying patterns to be etched through second etching.

It is preferable that a silicon oxide film be used as the lowest-layer insulating film and a gas including $C_4F_8$ be used as the etching reactive gas. As a result, by only adjusting the flow rate of the gas including $C_4F_8$, it is possible to sufficiently change the etching rate for the lowest-layer insulating film.

With reference to FIGS. 2A, 2B, 2C, 2D and 2E, manufacturing processes of one embodiment of the present invention will now be described.

Figure 2A:
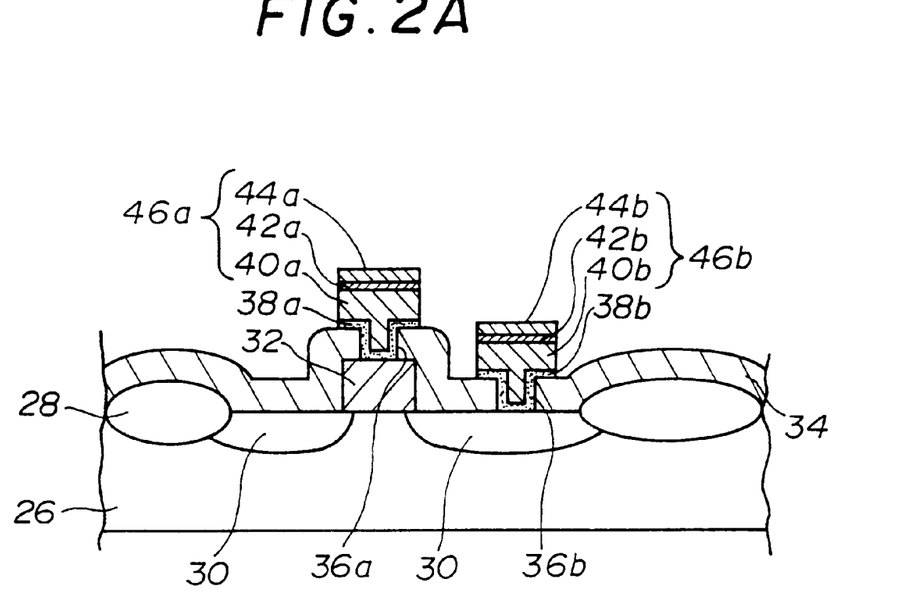
FIGS. 2A, 2B, 2C, 2D and 2E show sectional views illustrating a series of processes of a method of manufacturing a semiconductor device according to one embodiment of the present invention.

With reference to FIG. 2A, on a single-crystal silicon substrate 26, in an active area isolated by device-isolating regions 28, a gate electrode 32 is formed via a gate oxide film, and source-drain diffusion layers 30 are formed through an ion implantation process or the like. Then, an interlayer insulating film 34 is formed on the silicon substrate 26. Then, contact holes 36a, 36b are formed above the gate electrode 32 and the source-drain diffusion layer 30, respectively. Then, a barrier layer is deposited through sputtering on the entire surface of the silicon substrate 26. Then, from the bottom, sequentially in the below-stated order, for example, 500 nm of an AlCu film, 20 nm of a Ti film, and 50 nm of a TiN film are deposited through sputtering, and patterned. As a result, on the contact holes 36a, 36b, lower (first) wiring layers 46a, 46b including the AlCu films 40a, 40b, Ti films 42a, 42b and TiN films 44a, 44b are formed via the barrier layers 38a, 38b.

Figure 2B:
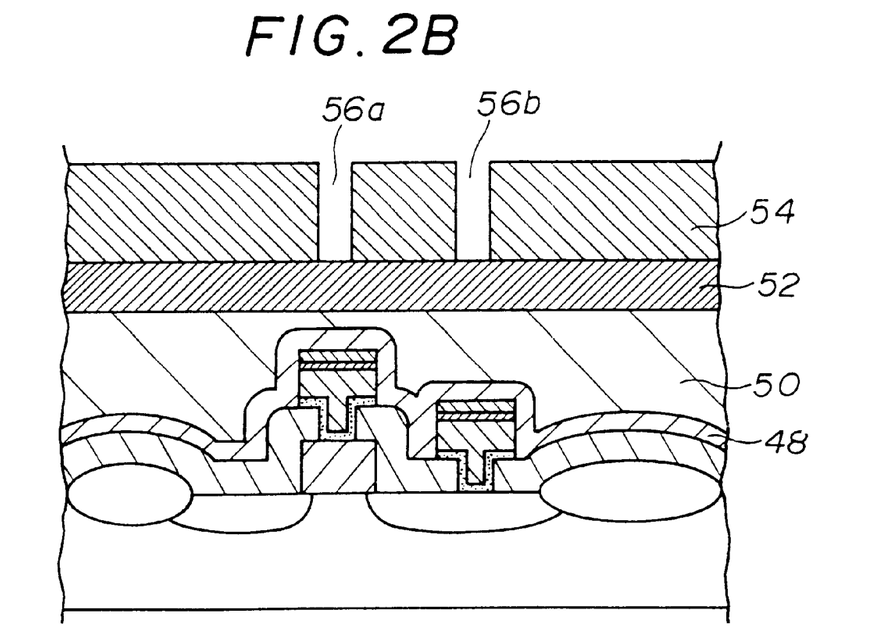

Then, with reference to FIG. 2B, on the silicon substrate 26, 100 nm of a bottom (base) film (silicon oxide film) 48 having a refractive index of approximately 1.57 is deposited, in a plasma CVD method, under a condition in which the gas flow rates are as follows: $SiH_4$: 150 sccm, $N_2$: 1500 sccm and $N_2O$: 3500 sccm, the pressure is 1.4 Torr and the RF (Radio Frequency) power is 100 W, for example. Then, in order to planarize the surface of the silicon substrate 26 as a result of filling lower-level portions of underlying patterns including the device isolating regions 28 and the first wiring layers 46a, 46b, 550 nm of an intermediate (flow-fill) film (silicon oxide film) 50 is deposited, in the atmospheric pressure CVD method, under a condition in which the gas flow rates are as follows: $SiH_4$: 120 sccm, $N_2$: 300 sccm, and $H_2O_2$: 0.65 g/min, for example. Then, 250 nm of a top (cap) film (silicon oxide film) 52 is deposited, in the plasma CVD method, under a condition in which the gas flow rates are as follows: $SiH_4$: 100 sccm, $N_2$: 1000 sccm, and $N_2O$: 2000 sccm, the pressure is 0.75 Torr, and the RF power is 500 W, for example. Then, in order to prevent moisture absorption of the intermediate film 50, moisture in the intermediate film 50 and the top film 52 is removed through an annealing process in the atmosphere of $N_2$ gas, an ambient temperature of 450° C., for 30 minutes, for example.

Thus, the interlayer insulating film includes the three layers, that is, the bottom film 48, the intermediate film 50 and the top film 52. Because the intermediate film 50 fills the lower portions of the underlying patterns, there is a variation in the thickness of the intermediate film 50, the maximum variation being 550 nm.

Then, in order to connect the first wiring layers 46a, 46b with second (upper) wiring layers, which will be described later, via holes are formed. In order to form the via holes, patterns 56a and 56b are formed by using photoresist 54. There is a difference, between 0 and 550 nm maximum, in the thicknesses of the intermediate film 50 below the patterns 56a and 56b.

Figure 3:
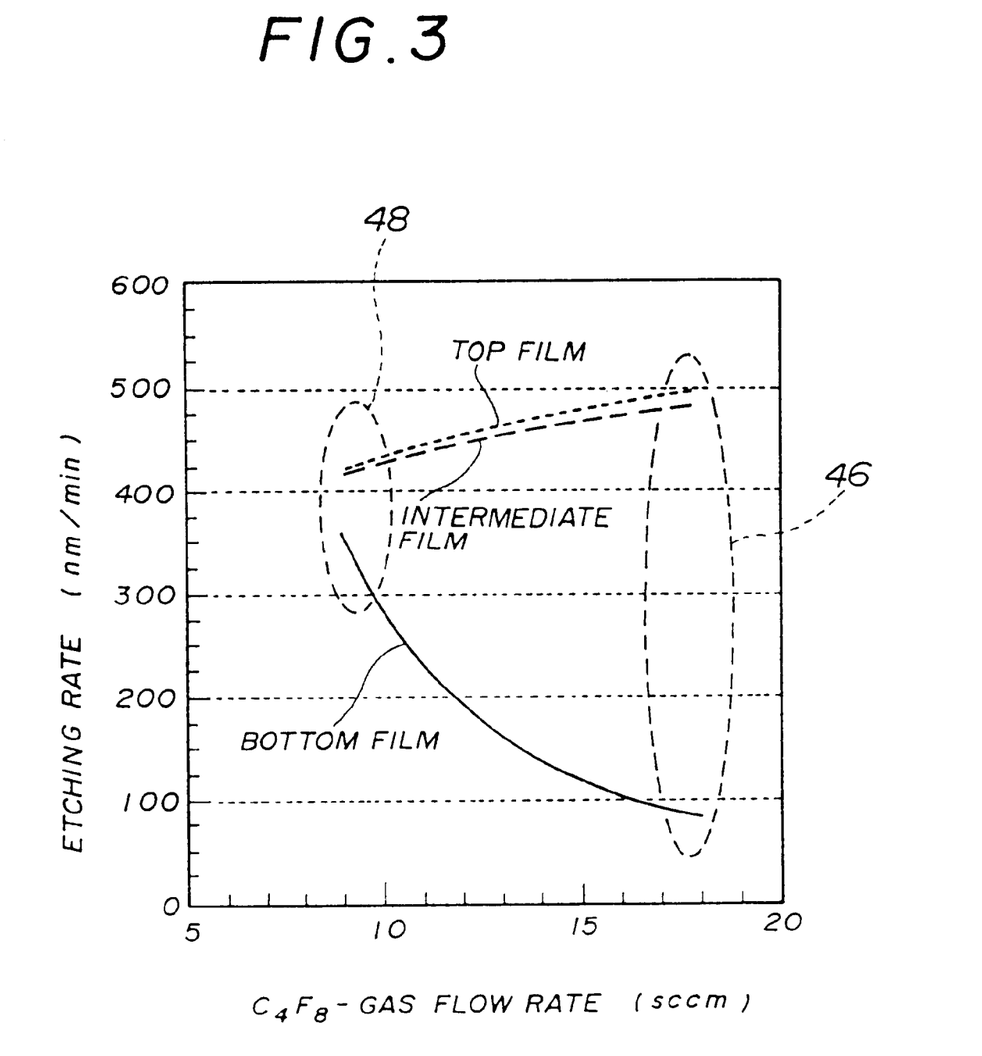
FIG. 3 shows the etching rate as a function of the $C_4F_8$-gas flow rate for a bottom film, an intermediate film and a top film.

In order to form the via holes, two-step etching is performed using a magnetron RIE (Reactive Ion Etching) device using a $C_4F_8$ gas as the etching gas, for example. In the first etching, at least the top film 52 and the intermediate film 50 are removed below the respective patterns 56a and 56b, and, in the second etching, the bottom film 48 is removed, below the respective patterns 56a and 56b. FIG. 3 shows the etching rate (nm/min) as a function of the $C_4F_8$-gas flow rate (sccm) for the bottom film 48, the intermediate film 50 and the top film 52, included in the interlayer insulating film. From FIG. 3, it is understood that, by changing the $C_4F_8$-gas flow rate, it is possible to greatly change the etching rate for the bottom film 48 which is the lowest film of the interlayer insulating film. In the embodiment, by using this feature, damage caused to the underlying pattern at the bottom of the shallow via hole is controlled to be minimum.

The condition under which the first etching of the two-step etching is performed is a condition in which the gas flow rates are as follows: $C_4F_8$: 18 sccm, $CHF_3$: 10 sccm, CO: 300 sccm, Ar: 400 sccm, and O2: 2 sccm, the pressure is 40 mTorr, the RF power is 1700 W (the diameter of the lower electrode: 8 inches), and the temperatures are as follows: the lower electrode: 20° C., the upper electrode: 60° C., and the sidewall: 60° C. Under this condition, the etching rates for the bottom film 48, the intermediate film 50 and the top film 52 are 80 nm/min, 480 nm/min and 500 nm/min, respectively (the zone 46 in FIG. 3).

Figure 2C:
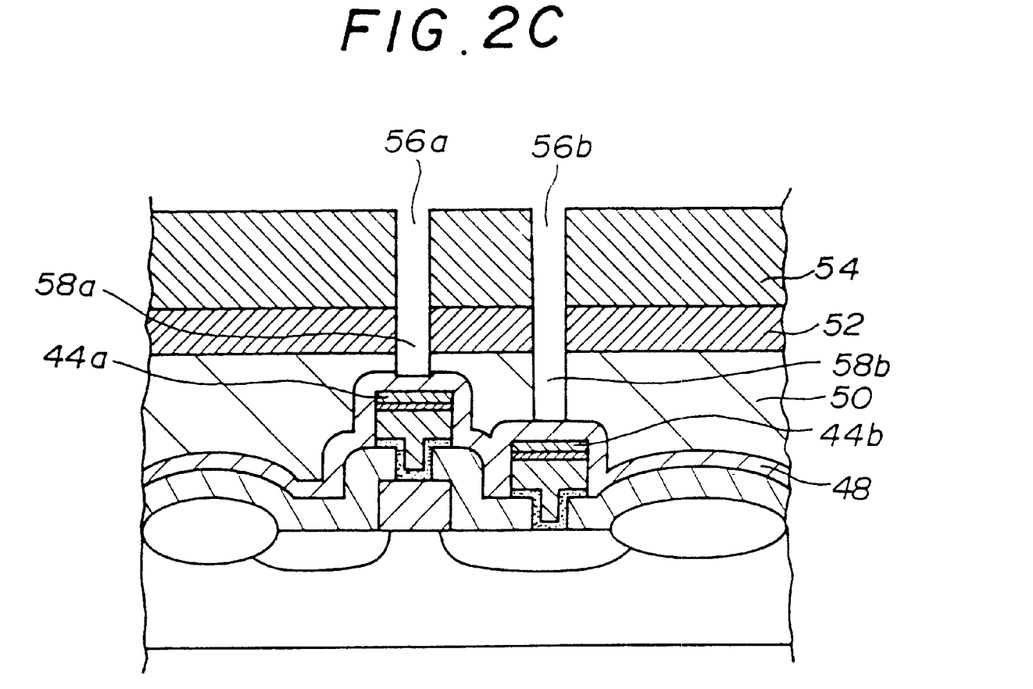

When the first etching is started, the top film 52 is etched through to the bottom thereof below the patterns 56a and 56b approximately simultaneously. Then, the intermediate film 50 starts being etched, below the patterns 56a and 56b. When the intermediate film 50 has been etched through to the bottom thereof below the pattern 56a and etching of the bottom film 48 is started below the pattern 56a, the intermediate film 50 has not been etched through to the bottom thereof below the pattern 56b. However, in the condition under which the first etching is performed, the etching rate for the bottom film 48 is less than 1/5 of the etching rate for the intermediate film 50. Therefore, merely a slight depth of the bottom film 48 is etched below the pattern 56a when the intermediate film 50 is etched through to the bottom thereof below the pattern 56b, as shown in FIG. 2C. As a result, it is possible to remove the top film 52 and the intermediate film 50 without causing the TiN films 44a and 44b to be exposed, below the patterns 56a and 56b.

The condition under which the second etching is performed is the same as the condition under which the first etching is performed except that the flow rate of the $C_4F_8$ gas is 9 sccm. Under this condition, the etching rates for the bottom film 48, the intermediate film 50 and the top film 52 are 360 nm/min, 420 nm/min and 420 nm/min, respectively (the zone 48 in FIG. 3). Further, under this condition, the etching rate for the TiN films 44a and 44b is 30 nm/min.

Figure 2D:
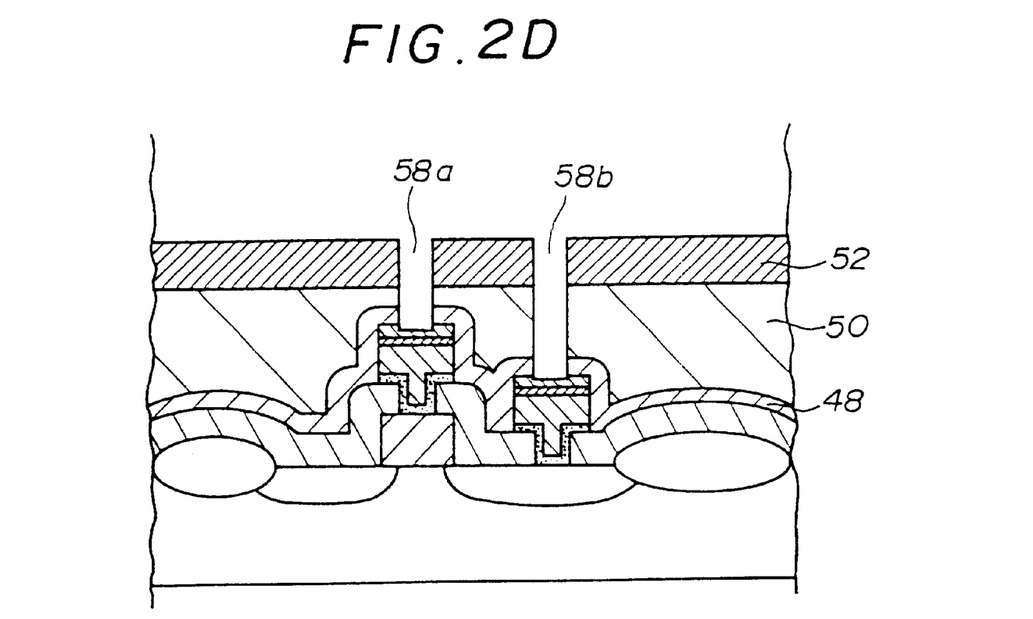

When the second etching is started, the thickness of the bottom film 48 remaining below the pattern 56a is approximately equal to the thickness of the bottom film 48 remaining below the pattern 56b. As a result, the time required for etching the remaining bottom film 48 to the bottom thereof below the pattern 56a is approximately the same as the time required for etching the remaining bottom film 48 to the bottom thereof below the pattern 56b. In actuality, before the bottom film 48 is etched through to the bottom thereof below the pattern 56b, the bottom film 48 is etched through to the bottom thereof below the pattern 56a and the TiN film 44a starts being etched below the pattern 56a. However, in the condition under which the second etching is performed, the etching rate for the TiN film 44a is approximately $\frac{1}{12}$ of the etching rate for the bottom film 48. Therefore, merely a slight depth of the TiN film 44a is etched below the pattern 56a when the bottom film 48 is etched through to the bottom thereof below the pattern 56b. As a result, without causing the TiN films 44a, 44b below the pattern 56a, 56b to be passed through so that the Ti films 42a and 42b and AlCu films 40a, 40b below the TiN films 44a, 44b are exposed, the bottom film 48 can be etched through to the bottom thereof below the patterns 56a and 56b, and, thus, the via holes 58a and 58b can be formed above the first wiring layers 46a, 46b. Then, the photoresist 54 is removed. Thus, the structure shown in FIG. 2D is obtained.

Figure 2E:
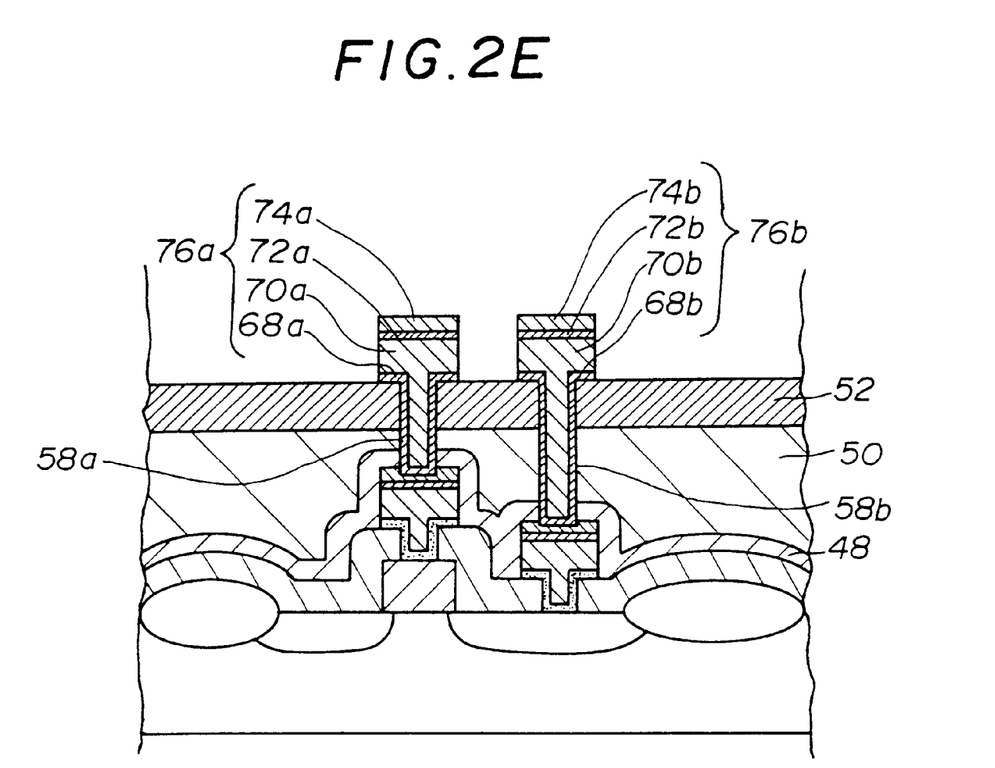

Then, 20 nm of a Ti film, 500 nm of an AlCu film, 20 nm of a Ti film and 50 nm of a TiN film are deposited through sputtering, in the stated order, on the top film 52, and are patterned. As a result, above the via holes 58a, 58b, the second wiring layers 76a, 76b including the Ti films 68a, 68b, the AlCu films 70a, 70b, the Ti films 72a, 72b and the TiN films 74a, 74b are formed, as shown in FIG. 2E. As shown in the figure, the Ti films 68a, 68b are formed on the bottom and the sidewall of the via holes 58a, 58b, respectively, and the via holes 58a, 58b are filled with AlCu 70a, 70b, respectively. Thus, the first wiring layers 46a, 46b are electrically connected with the second wiring layers 76a, 76b, respectively.

Figure 4A:
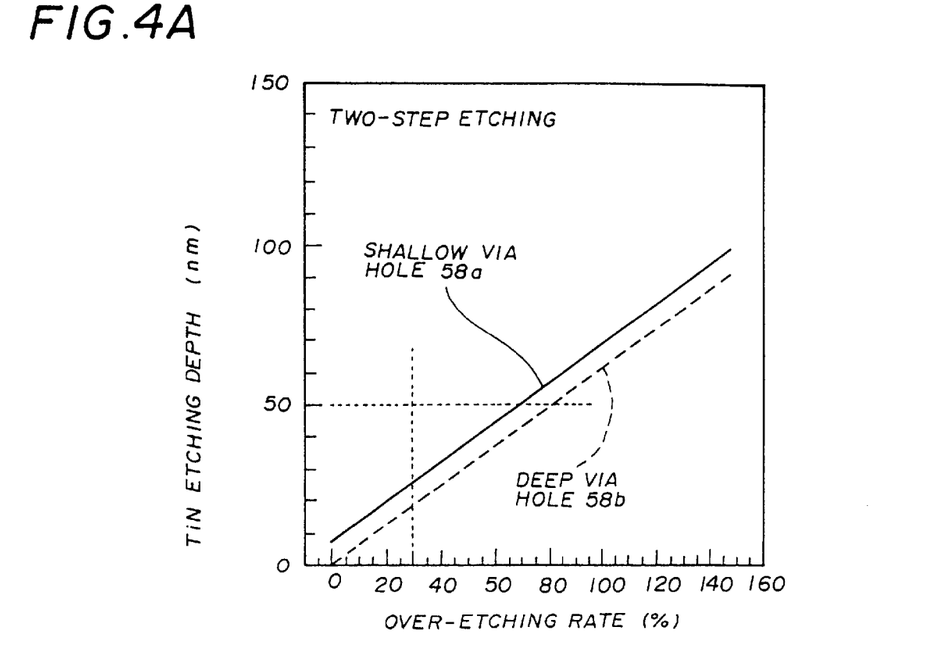
FIG. 4A shows the depth of a TiN film removed through two-step etching according to the embodiment of the present invention at positions at which via holes are formed as a function of the over-etching ratio.
Figure 4B:
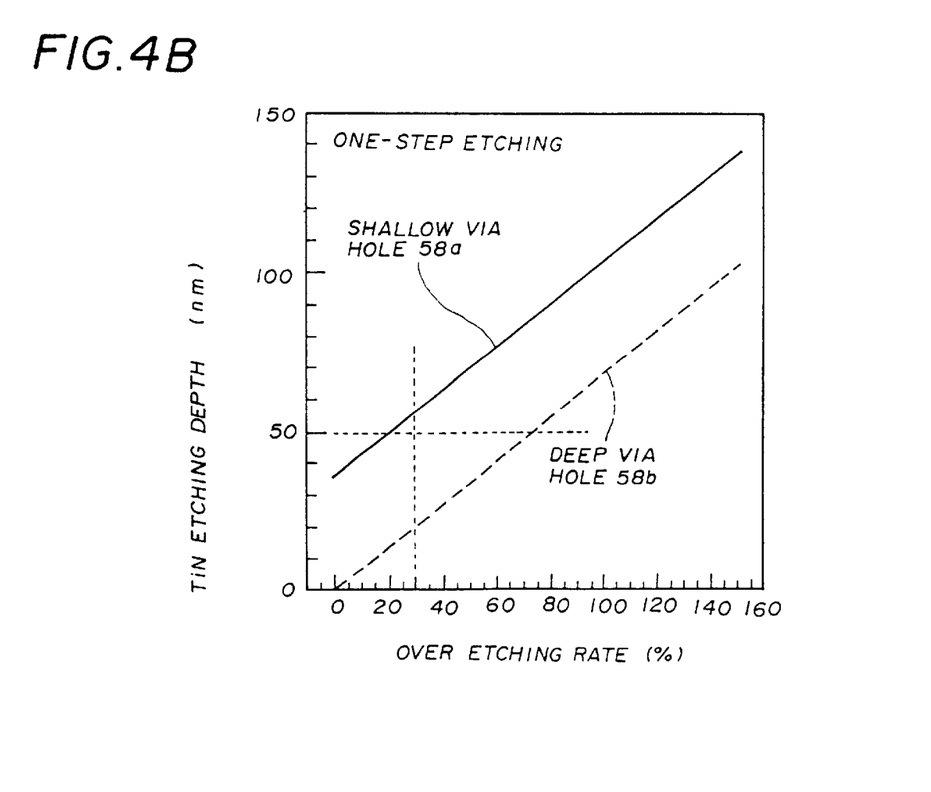
FIG. 4B shows the depth of the TiN film removed through one-step etching in the related art at the positions at which the via holes are formed as a function of the over-etching ratio.

FIG. 4A shows the depth (nm) of the TiN film removed through the two-step etching according to the embodiment of the present invention at the positions at which the via holes are formed (TiN etching depth) as a function of the over-etching ratio (%). FIG. 4B shows the depth (nm) of the TiN film removed through one-step etching in the related art at the positions at which the via holes are formed (TiN etching depth) as a function of the over-etching ratio (%), for reference. The one-step etching is performed on the structure shown in FIG. 2B, and the condition under which the one-step etching is performed is the same as the condition under which the second etching of the two-step etching is performed. That is, the etching rates for the base film 48, the intermediate film 50 and the top film 52 are 360 nm/min, 420 nm/min and 420 nm/min, respectively, and the etching rate for the TiN films 44a and 44b is 30 nm/min. The values of the over-etching ratio in the graphs shown in FIGS. 4A and 4B are the values in the case where the deepest via hole, that is, the via hole 58b is formed.

Usually, in consideration of variation in film thickness of the interlayer insulating film and variation in etching rate within the wafer surface, the over-etching is performed such that over-etching on the order of 30% is achieved for the deep via hole 58b. In the case of the one-step etching, when the over-etching is performed such that the over-etching of 30% is achieved for the deep via hole 58b, the depth of the TiN film 44a removed below the shallow via hole 58a through the one-step etching is approximately 55 nm, as shown in FIG. 4B. Because the thickness of the TiN film 44a is 50 nm, the TiN film 44a is etched through to the bottom thereof below the pattern 56a. On the other hand, in the case of the two-step etching according to the embodiment of the present invention, when the over-etching is performed such that the over-etching of 30% is achieved for the deep via hole 58b, the depth of the TiN film 44a removed below the shallow via hole 58a through the two-step etching is approximately 25 nm, and the depth of the TiN film 44b removed below the deep via hole 58b through the two-step etching is approximately 20 nm, as shown in FIG. 4A. Thus, regardless of the depths of the via holes, it is possible to retain a thickness of the TiN films on the order of 25 nm. Therefore, in comparison to the case of the one-step etching in the related art, it is possible to equalize the conditions of the bottoms of the via holes and to form the via holes and wirings having high reliability.

Further, the present invention is not limited to the above-described embodiment, but variations and modifications may be made without departing from the scope of the present invention.

The contents of the basic Japanese Patent Application No. 10-020464, filed on Jan. 14, 1998, are hereby incorporated by reference.

What is claimed is:

1. A method of manufacturing a semiconductor device in which an interlayer insulating film is formed on an underlayer having a level variation, the surface of said interlayer insulating film being planarized, upper wiring layers and lower wiring layers being electrically connected through via holes formed in said interlayer insulating film so that a multi-layer wiring is provided, said method comprising the steps of:

a) forming a lowest-layer insulating film of said interlayer insulating film on said underlayer, the etching rate for said lowest-layer insulating film changing in response to change in flow rate of an etching reactive gas in a first manner;

b) forming at least one upper-layer insulating film of said interlayer insulating film on said lowest-layer insulating film, the etching rate for said at least one upper-layer insulating film changing in response to change in flow rate of said etching reactive gas in a second manner different from said first manner;

c) planarizing the surface of said at least one upper-layer insulating film;

d) forming a photoresist on said at least one upper-layer insulating film, said photoresist having openings at positions at which the via holes are formed in said lowest-layer insulating film and said at least one upper-layer insulating film;

e) etching said at least one upper-layer insulating film below said openings under a condition in which said etching reactive gas is applied at a first flow rate, such that said lowest-layer insulating film is etched at a first etching rate;

f) subsequently, etching said lowest-layer insulating film of said interlayer insulating film, below said openings of said photoresist, under a condition in which said etching reactive gas is applied at a second flow rate, said second flow rate is less than said first flow rate, such that said lowest-layer insulating film is etched at a second etching rate, said second etching rate being at least three times more than said first etching rate;

g) removing said photoresist; and h) forming said upper wiring layers above said via holes.

2. The method as claimed in claim 1, wherein the first etching rate for said lowest-layer insulating film is equal to or less than ⅕ of the etching rate for said at least one upper-layer insulating film.

3. The method as claimed in claim 1, wherein: a silicon oxide film is used as said lowest-layer insulating film; and a gas including $C_4F_8$ is used as said etching reactive gas.

4. The method as claimed in claim 1, wherein:

said at least one upper-layer insulating film comprises a middle-layer insulating film and a highest-layer insulating film;

said etching reactive gas comprises a $C_4F_8$ gas;

said step e) is performed under the condition in which the flow rate of said $C_4F_8$ gas is 18 sccm so that the first etching rate for said lowest-layer insulating film is 80 nm/min, the etching rate for said middle-layer insulating film is 480 nm/min and the etching rate for said highest-layer insulating film is 500 nm/min; and said step f) is performed under the condition in which the flow rate of said $C_4F_8$ gas is 9 sccm so that the second etching rate for said lowest-layer insulating film is 360 nm/min, the etching rate for said middle-layer insulating film is 420 nm/min and the etching rate for said highest-layer insulating film is 420 nm/min.

5. The method as claimed in claim 2, wherein said lowest-layer insulating film has a refractive index of approximately 1.57.

6. The method as claimed in claim 3, wherein the silicon oxide film used as the lowest-layer insulating film is produced from gases of $SiH_4$, $N_2$ and $N_2O$.

7. The method as claim in claim 3, wherein the silicon oxide film used as the lowest-layer insulating film comprises nitrogen.

* * * * *